(12) United States Patent
Do et al.

(10) Patent No.: US 7,486,141 B2
(45) Date of Patent: Feb. 3, 2009

(54) WIDE BANDWIDTH, HIGH POWER AMPLIFIER

(75) Inventors: Ky-Hein Do, Kihei, HI (US); James Schellenberg, Kihei, HI (US); Kevin Miyashiro, Makawao, HI (US)

(73) Assignee: Trex Enterprises Corp., San Diego, CA (US)

( * ) Notice: Subject to any disclaimer, the term of this patent is extended or adjusted under 35 U.S.C. 154(b) by 0 days.

(21) Appl. No.: 11/644,402

(22) Filed: Dec. 21, 2006

(65) Prior Publication Data

US 2007/0152751 A1     Jul. 5, 2007

Related U.S. Application Data

(60) Provisional application No. 60/752,582, filed on Dec. 21, 2005.

(51) Int. Cl.
*H03F 3/26* (2006.01)

(52) U.S. Cl. .................... 330/276; 330/295

(58) Field of Classification Search ............... 330/276, 330/165, 295, 124 R, 84, 126
See application file for complete search history.

(56) References Cited

U.S. PATENT DOCUMENTS

| | | | | |
|---|---|---|---|---|
| 3,097,344 | A | * | 7/1963 | Van Der Linden et al. .. 330/295 |
| 3,911,372 | A | * | 10/1975 | Seidel ........................ 330/286 |
| 4,901,032 | A | * | 2/1990 | Komiak ...................... 330/277 |
| 7,358,806 | B2 | * | 4/2008 | Burns et al. ............. 330/124 R |

\* cited by examiner

*Primary Examiner*—Henry K Choe
(74) *Attorney, Agent, or Firm*—John R. Ross

(57) ABSTRACT

A wide bandwidth, high power amplifier system for amplifying a signal in a radio frequency (RF) system in a specific bandwidth within the frequency range from 1 MHz to 100 GHz. The system includes a number of amplifier modules and an equal number of input transformers connected in series, with each input transformer providing an input signal to one amplifier module. It also includes an equal number of output transformers connected in series with each output transformer receiving an input signal from one amplifier module. The series of input transformers, the series of output transformers and the amplifier modules each provide an impedance matched approximately to the impedance of the RF system.

19 Claims, 9 Drawing Sheets

WIDE BANDWIDTH, HIGH POWER AMPLIFIER

CROSS REFERENCE TO RELATED APPLICATIONS

This application claims the benefit of U.S. Provisional Application No. 60/752,582, filed Dec. 21, 2005.

FEDERALLY SPONSORED RESEARCH

This invention was made in the performance of a contract (Contract No. N68936-06-C-0051) with the Naval Air Systems Command (NAVAIR) and the United States Government has rights in the invention.

BACKGROUND OF THE INVENTION

1. Field of the Invention

This invention relates to radio frequency (RF) power amplifiers and in particular to wide bandwidth and high power radio frequency amplifiers.

2. Prior Art Solid State Power Amplifiers

Power amplifiers are the most functional-restrictive and cost-inhibit element within a communication system. More often than not, the output power parameter is achieved at the expense of bandwidth. In other words, output power and bandwidth are two parameters to be traded-off in the design of conventional power amplifiers. The reason for such compromise is due to the fact that, for example, a conventional solid-state power amplifier is normally comprised of many active devices combined in parallel to achieve the required power level. When many active devices are combined in parallel, the collective impedance decreases drastically. Subsequently, this combined and reduced impedance must be transformed back to the 50-Ohm system using an elaborate, often in a form of a multi-section topology, circuit which is either narrow band or large in size or both. Thus, conventional power amplifier designs often yield limited bandwidth.

Previously proposed power amplifier architectures employ non-stacked balun transformers, circular topology or series biasing technique to realize the power combiner/splitter circuitry. For example, a broadband balun and impedance transformer for push-pull amplifiers are described in Zhao et al., U.S. Pat. No. 6,819,200. A power splitter/combiner circuit, high power amplifier and balun circuit is described in Ishida et al., U.S. Pat. No. 6,803,837. A distributed circular geometry power amplifier architecture is described in Aoki et al., U.S. Pat. No. 6,737,948. A high-voltage series-biased FET amplifier for high-efficiency applications is described in Schellenberg, U.S. Pat. No. 6,163,220. These patents are incorporated herein by reference. However, these prior art amplifier architectures fall far short of realizing an amplifier architecture that can simultaneously achieve both very high output power (up to kilo-Watts) and extremely wide bandwidth (multi-octave or even decade).

For example, FIG. 2 shows the circuit schematic of a prior art power amplifier in which eight transistors are being combined in parallel, by means of a corporate (also know as 'binary') combining scheme. If the assumption is made that the terminal impedance of each transistor being deployed here is a real 4-Ohms, at either the input or output side, the combined impedance of eight parallel transistors will be 0.5-Ohm. Matching 0.5-Ohm to the system impedance of 50-Ohms at the ports, even over a modest bandwidth, is a significant challenge, if not impossible at times. Moreover, a corporate combiner must utilize several stages to accomplish the desired output power level. If the number of devices being combined can be expressed as $2^n$, then there will n number of stages needed thus given rise to the name 'binary' combining scheme. Total insertion loss becomes very significant as the result and it is the key factor that curtails the use of corporate combiner in applications in which both wide bandwidth and high power are simultaneously required.

As shown in the simple example above, even when the reactive component of the device impedance is neglected and when only eight devices are combined, the performance of corporate combiners in high power applications is quite limited in terms of bandwidth and power. There are two main difficulties here. One is the matching of the combined device impedance to a real resistive value and the second is the transformation of that real resistance to a 50-Ohm system, over a reasonable bandwidth and with practical insertion loss.

In terms of efficiency, due to its binary nature, a corporate scheme needs to combine either exactly 2 or 4 or 8 or 16 or $2^n$ devices, without exception. For example, this means that even when the required power level calls for the use of only 20 active devices, actually 32 devices will be deployed instead. This leads to gross inefficiency as the number of devices to be used is large. In power amplifier circuits, inefficiency leads to more difficult thermal management and ultimately poor reliability. Again, this attribute of corporate-combined amplifiers is also not very desirable.

Also in wide band (for example, more than one octave) amplifiers, corporate power combine offers little defense against high harmonic contents especially when the second harmonic of an excitation tone falls within the bandwidth of interest. This again is another undesirable attribute of conventional power amplifier design because of the fact that second harmonics are the main contributors to the creation of the menacing third-order inter-modulation products. These inter-modulation products are very harmful to modern modulation schemes.

FIG. 3 shows another prior art of a solid-state amplifier in which the active devices are operated in a push-pull mode, within a corporate scheme. The push-pull configuration alleviates somewhat the impedance matching issue and allows second harmonic terminations by making use of the virtual grounds associated with the push-pull topology. However, the prior art shows in FIG. 3 is still hampered by the matching and impedance transformation issues, by the insertion loss issue and by the inefficiency issue.

Prior art power amplifiers are discussed in the following papers authored by two of the present inventors: "Low-loss, Planar Monolithic Baluns for K/Ka-Band Applications", James Schellenberg and Ky-Hien Do, 1999 Microwave Theory and Techniques Symposium MTT-S, Anaheim, Calif., US and "A Push-Pull Power MMIC Operating at K/Ka-Band Frequencies", James Schellenberg and Ky-Hien Do, 1999 Microwave Theory and Techniques Symposium MTT-S, Anaheim, Calif., US.

Traveling Wave Vacuum Tubes

Another prior art power amplifier example is vacuum tube amplifiers. Traditionally, vacuum traveling wave tube amplifiers are used as the power amplifiers of choice in the systems of interest. This is due to the fact that the vacuum tube amplifiers have good output power, possess wide bandwidth and have excellent efficiency. FIG. 4 shows the mechanical construction of a typical traveling wave tube (TWT) amplifier. TWT amplifiers are usually comprised of three main sections, namely the electron gun, the helix coil (a slow wave structure) and the collector. As the name suggests, the electron gun is a cathode and anode assembly that emits electrons. These electrons travel through the helix coil, in which they interact with the RF/microwave signal and transfer the energy they are carrying to amplify that signal. The spent electrons are then collected in the collector.

As can be seen, the TWT amplifier possesses many single points of failure. The manufacturing and fine-tuning process for each TWT amplifier is very time consuming. The operations of each section are highly dependent on the others, thus, servicing one section often calls for the complete retune of the others. During storage, a strict and costly maintenance procedure must be carried out for TWTs. Moreover, due to the slow wave structure (helix coil) being electrically long, TWT amplifiers possess poor gain ripple and group delay responses which are undesirable for a number of modem communication modulation schemes. Furthermore, the power supplies associated with TWT amplifiers require very high voltages which are prone to various failure mechanisms. Recently, there are efforts to produce TWT amplifiers using microfabrication techniques to address the issues of manufacturability, however, the critical issues of group delay variations and high voltage power supplies remain. The problems with low reliability, poor serviceability, high gain ripples, non-constant group delay and DC power supply diminish the use of TWT in many critical applications.

What is needed is better wide-bandwidth high-power amplifier for the radio frequencies through millimeter wave spectral ranges.

SUMMARY OF THE INVENTION

The present invention provides a solid-state amplifier architecture which addresses both of the matching and impedance transformation issues, over a wide bandwidth. This invention also provides a solution to the problems of poor efficiency and harmonic termination. The invention provides an architecture that is superior to the circuits of the prior art, in terms of performance, manufacturability, reliability and cost. The present invention provides additional advantages over vacuum tube amplifiers, due to graceful degradation attribute of the amplifiers of the present invention.

The present invention provides a wide bandwidth, high power amplifier system for amplifying a signal in a RF system in a specific bandwidth within the frequency range from 1 MHz to 100 GHz. The system includes a number of amplifier modules and an equal number of input transformers connected in series, with each input transformer providing an input signal to one amplifier module. It also includes an equal number of output transformers connected in series with each output transformer receiving an input signal from one amplifier module. The series of input transformers, the series of output transformers and the amplifier modules each provide an impedance matched approximately to the impedance of the RF system.

DETAILED DESCRIPTION OF THE PREFERRED EMBODIMENT

First Preferred Embodiment

Figure 1:
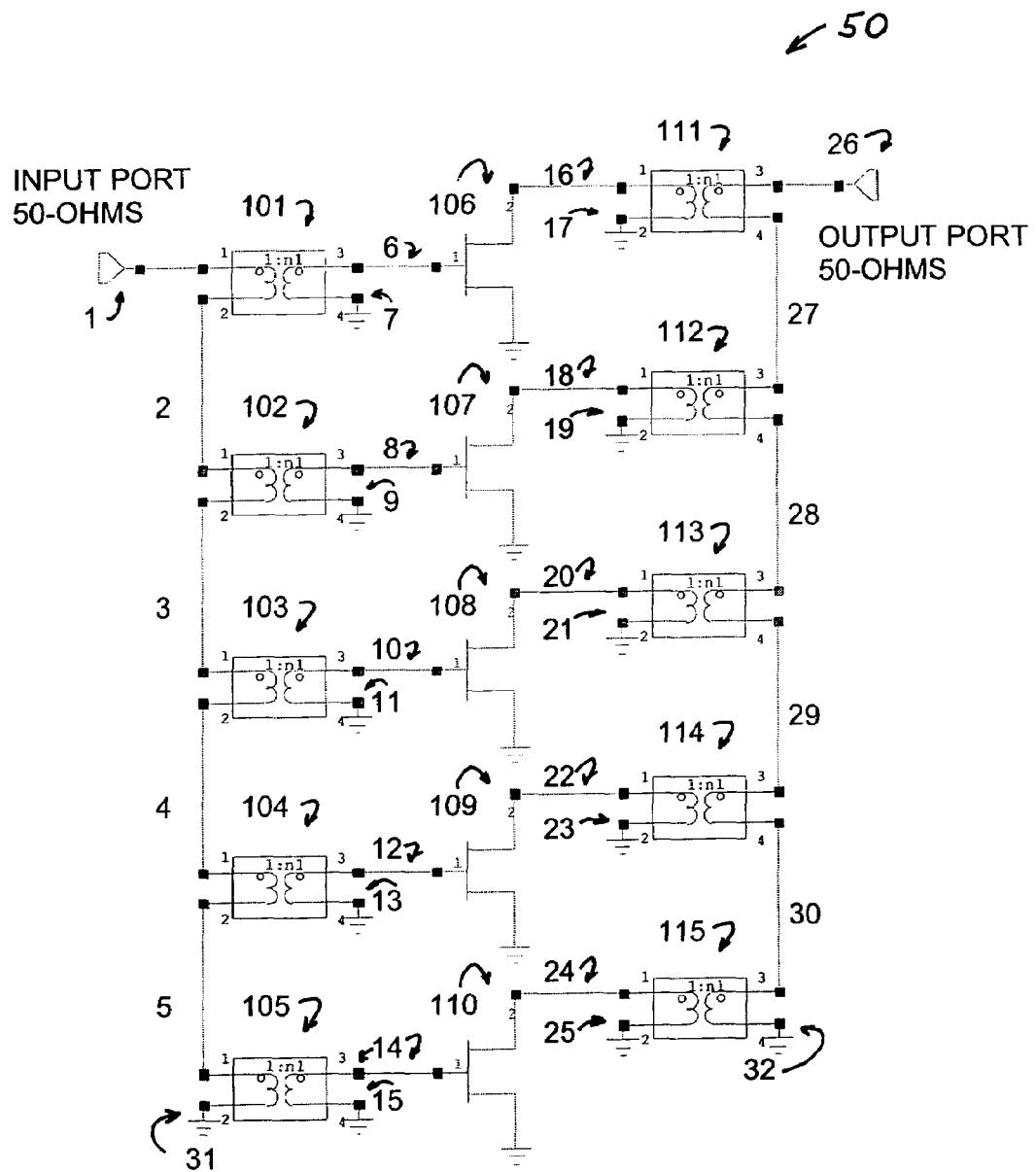
FIG. 1 shows the ideal circuit diagram of the most basic architecture of the propose art series RF solid-state amplifier, in which 1:1 transformers are stacked to create a multi-tap transformer for impedance matching and transformation purposes.
Figure 2:
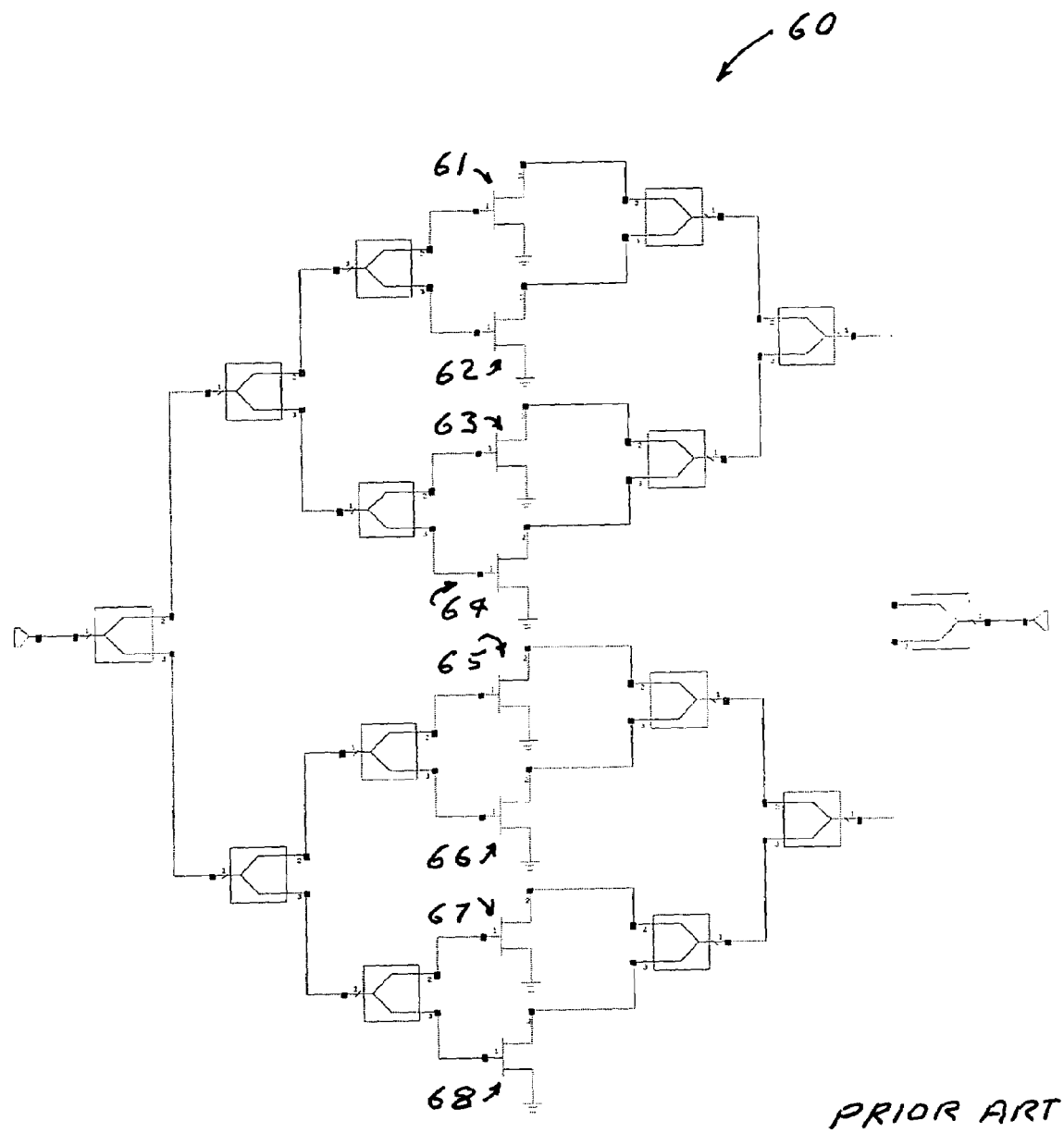
FIG. 2 shows the circuit diagram of a prior art solid-state amplifier in which active devices are combined using corporate combiners.
Figure 3:
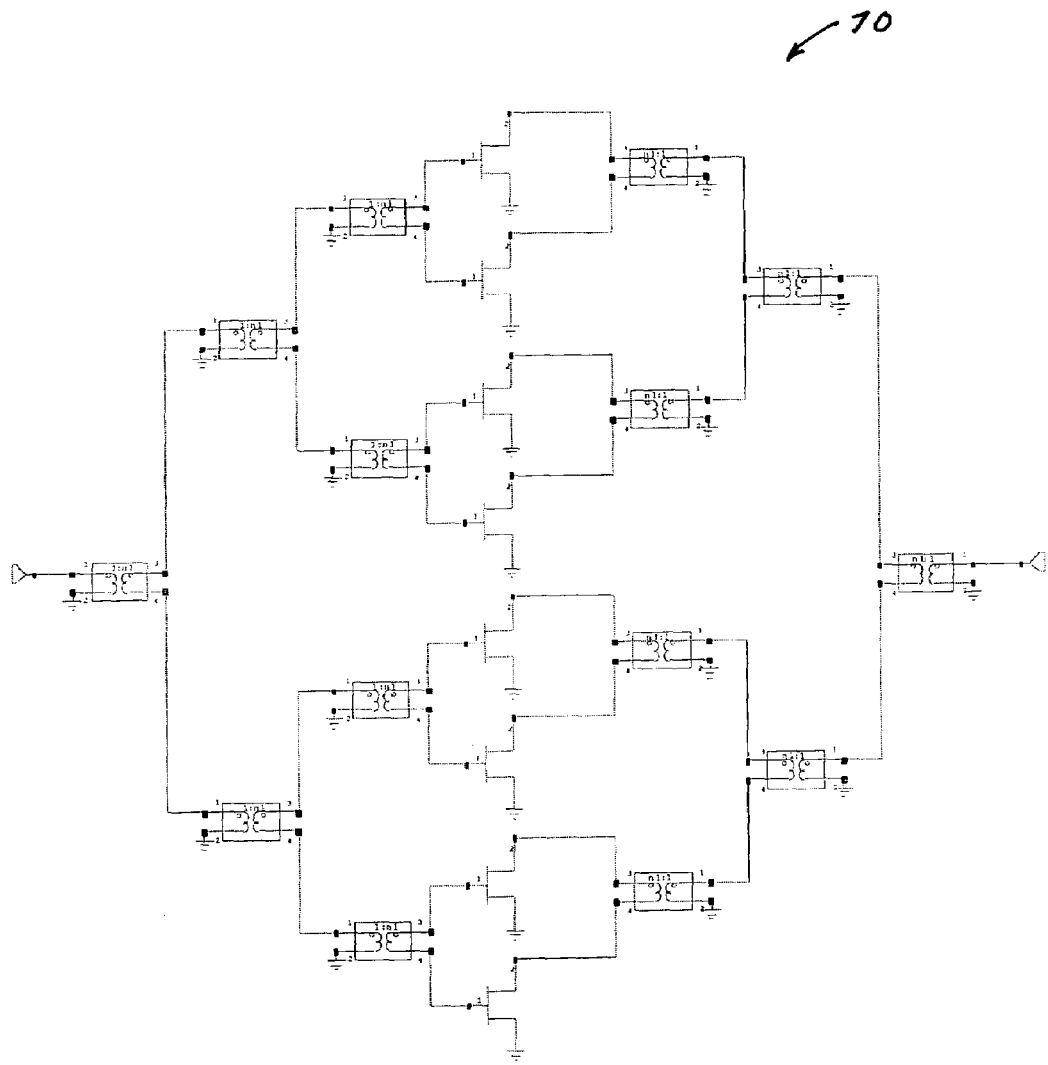
FIG. 3 shows the circuit diagram of a prior art solid-state amplifier in which active devices are combined using push-pull corporate combiners.
Figure 4:
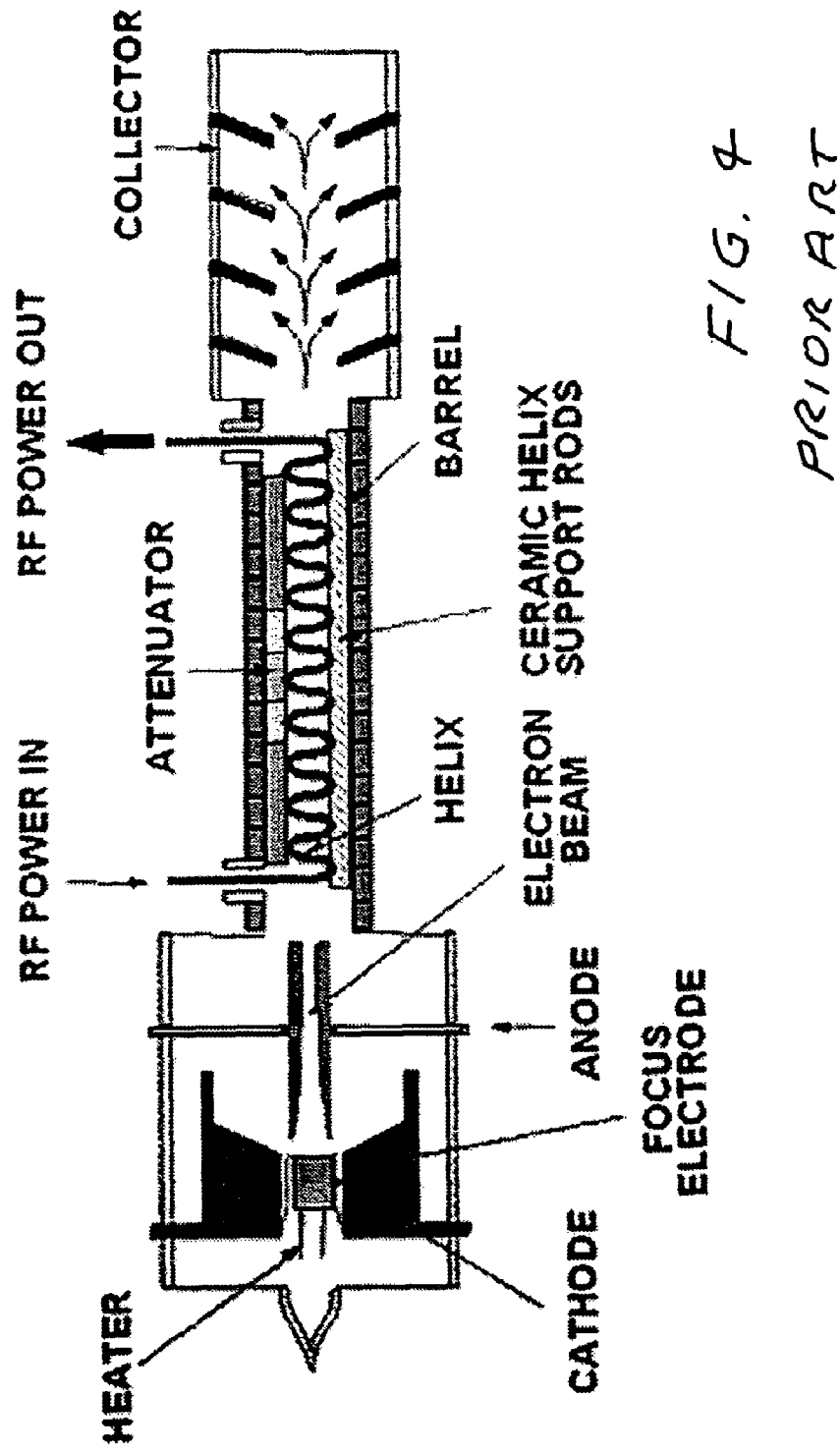
FIG. 4 shows the drawing of a prior art which depicts the construction of a vacuum traveling wave tube amplifier.

A preferred embodiment of the present invention is shown in FIG. 1. This embodiment provides a high power solid-state amplifier over a wide bandwidth. It is comprised of a series connection of 1:1 transformers to address the issues associated with impedance matching and impedance transformation typical in an amplifier design.

This embodiment provides a 1.0 kW amplifier system 50 matched in impedance to a standard 50-Ohm input port 1 and a 50-Ohm output port 26. The architecture of amplifier unit 50 provides the desired amplification with the impedance needed to match the input and output ports utilizing the special design techniques of the present invention. Applicants for this purpose utilize five 200W amplifier modules 106, 107, 108, 109 and 110. Each of these modules is comprised of five 50 Watt transistors (Part Number MRF9060) supplied by Motorola. Four of the five transistors are connected in series to provide the 200 Watt capacity and one of the five transistors is used to drive the four output transistors to provide a 22 dB gain of amplifier system 50. Each 200W amplifier module is designed to possess a 10-Ohm input and output impedance. As shown in FIG. 1, the inputs of the five amplifier modules 106, 107, 108, 109 and 110 are connected together by series stacking 1:1 transformers 101, 102, 103, 104 and 105. Each of these 1:1 transformers is specially designed to provide an impedance of 10-Ohms. This is accomplished using well-known prior art techniques with the proper selection of wire gage number of turns and core material, size and shape, in the case of a low-frequency wound transformer. These transformers can also be constructed using well known structures such as quarter-wave, Marchand or Guanella baluns, at higher frequencies. These 1:1 transformers convert the active device's input impedances to a ladder network which in turn adds these impedances linearly. The total impedance of the ladder network is equal that of the input port impedance, i.e., (in this case) 50-Ohms. Similarly, the outputs of transistors 106, 107, 108, 109 and 110 are connected together by series stacking transformers 111, 112, 113, 114 and 115. The total impedance of the output ladder network is thus equal to the 50-Ohm output port impedance as well. The stacked transformers match each active device to its desired terminal impedance level and simultaneously add those impedances to reach the port impedance, which is 50-Ohms normally. Nodes 7, 9, 11, 13, 15, 17, 19, 21, 23, 25, 31 and 32 are grounded to achieve the proper transforming effects. For clarity, the bias circuitry is not shown in FIG. 1. If the drain biases are to be applied, they can be applied to node 16, 18, 20, 22 and 24. Similarly, the gate biases can be applied to node 6, 8, 10, 12 and 14. Also, the excitation sources are to be applied to node 1 and 26, denoted as Input Port and Output Port respectively.

In other words, in FIG. 1, transformers 101, 102, 103, 104 and 105 are connected to form a multi-tap transformer to achieve the impedance-addition effect at the input side. Similarly, transformers 111, 112, 113, 114 and 115 are to form another multi-tap transformer at the output side. FIG. 1 therefore represents a basic form of the amplifier architecture of the present invention.

Figure 7:
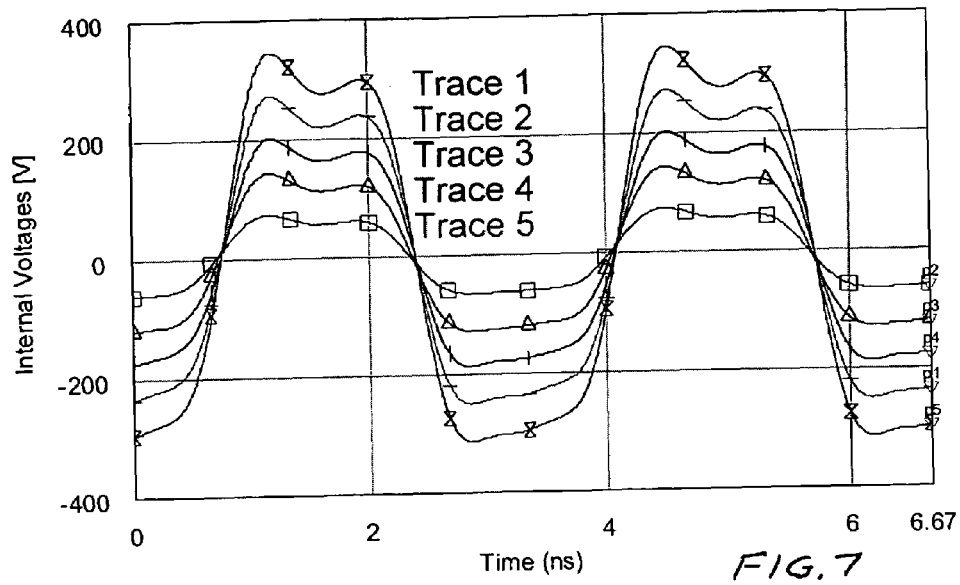
FIG. 7 shows the time-domain simulation results of the 1 kW power amplifier to demonstrate the inner working of the amplifier, as depicted in FIG. 6.
Figure 8:
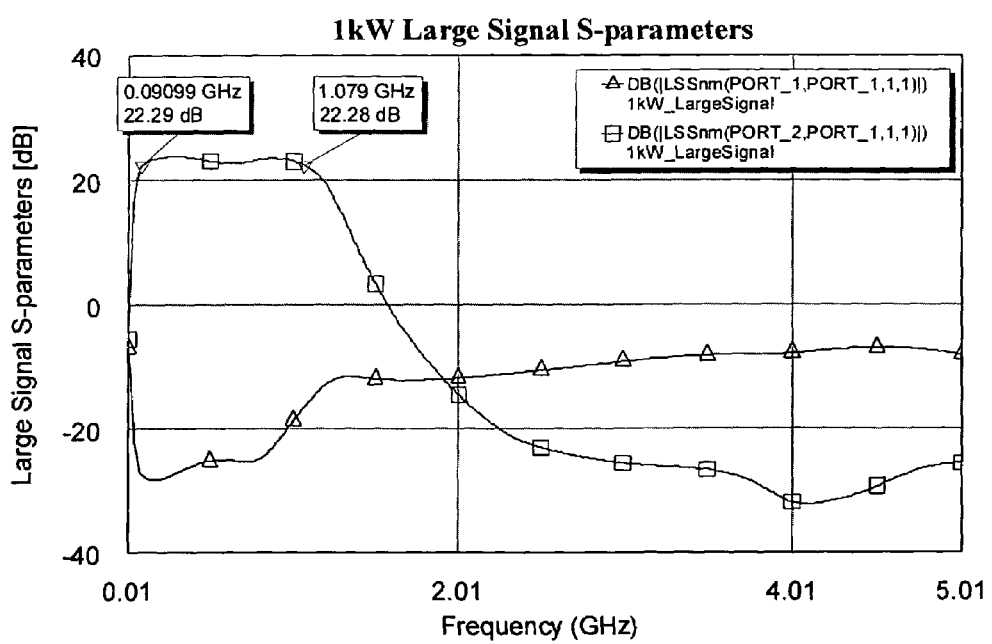
FIG. 8 shows the large-signal S-parameter simulation results of the 1 kW power amplifier, as depicted in FIG. 6.
Figure 9:
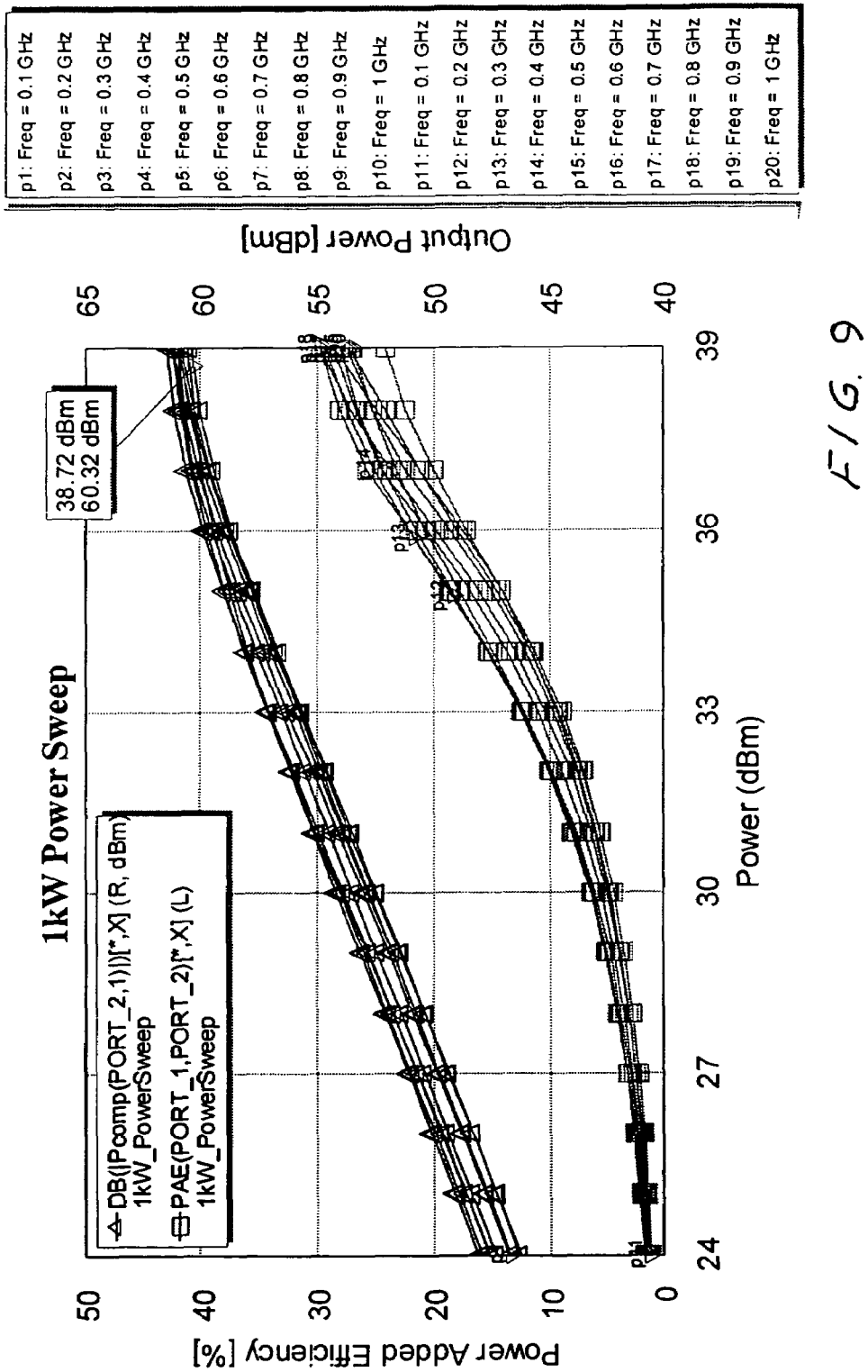
FIG. 9 shows the output power and PAE simulation results of the 1 kW power amplifier, as depicted in FIG. 6.

Performance of an amplifier system very similar to the FIG. 1 architecture has been simulated by Applicants with the results presented in FIGS. 7, 8 and 9. These results show performance of 1 kW at 22 dB gain with one decade of bandwidth.

Advantages of Present Invention

Since the transformation ratio required is 1:1, it is quite possible to construct these transformers at any frequency of interest, even at millimeter-wave frequencies or beyond.

The advantages of the series RF impedance-addition architecture are as follows.

Figure 5:
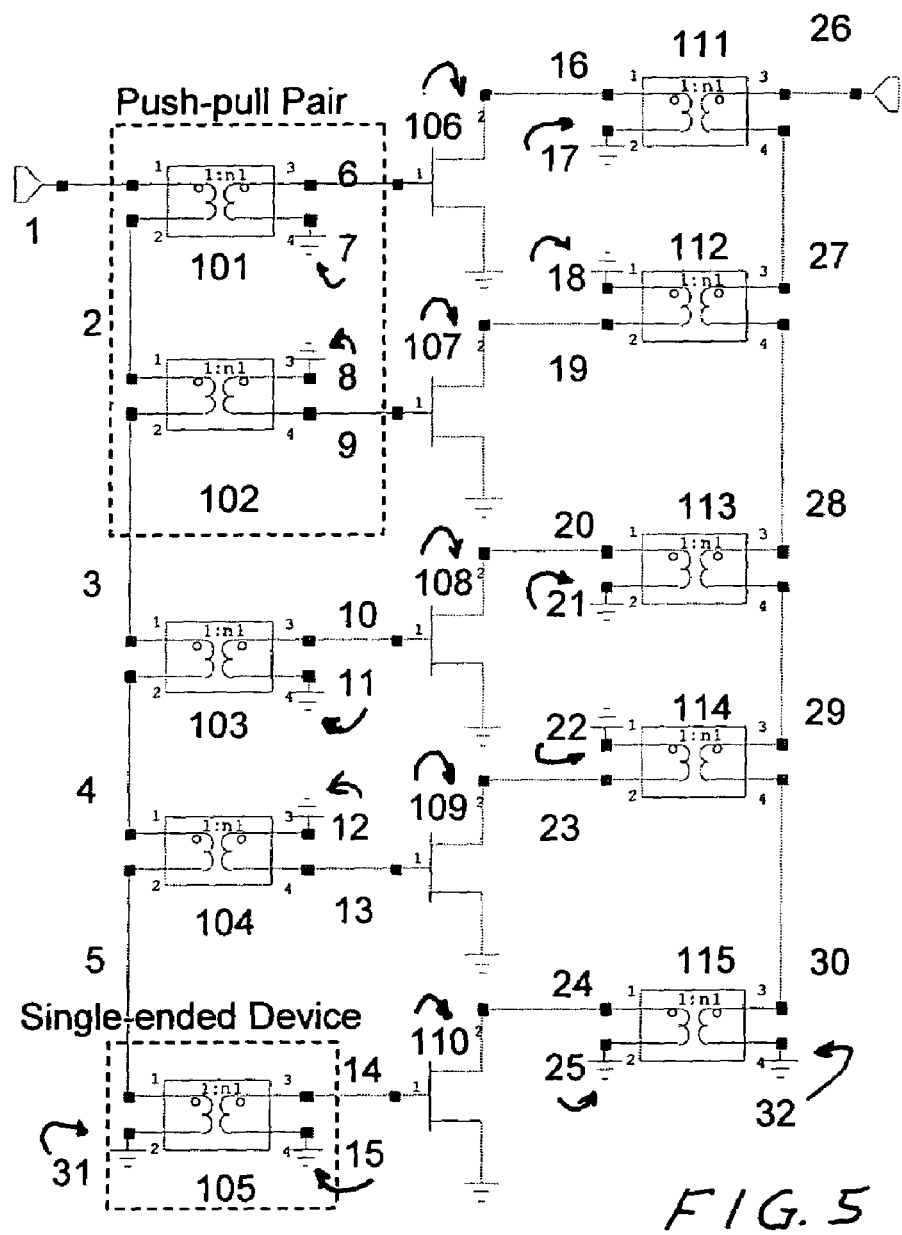
FIG. 5 shows a circuit diagram of the proposed art power amplifier operated in partial push-pull mode, to improve common-mode noise rejection, even harmonic termination and efficiency.

1. The elementary active devices can be matched to a low impedance to improve bandwidth, to reduce matching circuit complexity and to reduce cost. For example, each can be matched to 10-Ohms in the case in point stated above. In contrast, in a parallel power combine scheme, each device usually has to be matched to a impedance much higher than 50-Ohms.
2. The port impedance is matched by series-connecting the appropriate number of active devices, in a ladder topology. There is no need for any other impedance transformation, an activity which will further compromise bandwidth.
3. If one of the active devices fails electrically to become short-circuited, as often is the case with the field effect transistors (FETs) being deployed at high frequencies, the transformed ladder network can be design in such a manner so as to redistribute the port voltage across all surviving FETs, thus offers a self-healing attribute. The proposed topology is thus very robust and possesses a highly graceful degradation characteristic. This feature of enhanced reliability of the power amplifier system is very useful.
4. The exact number of transistors can be used to satisfy the required power level. There is no need to follow the 'binary' enumeration. This will address the efficiency issue.
5. Since the topology is constructed using series transformers, it is possible to operate the whole amplifier (should the number of active devices is even) or a part of the amplifier (should the number of active devices is odd) in a push-pull mode to improve common-mode noise rejection and even harmonic responses. This is explained in detail below and shown in FIG. 5. It should be noted that FIG. 5 is exactly the same as that of FIG. 1 except for a single difference. In FIG. 5 the ground connections of two adjacent active devices are modified, from FIG. 1, to accomplish a push-pull topology. In the particular example shown in FIG. 5, because there are 5 active devices, only 4 will operate in 2 push-pull pairs and the other device operates in a single-ended manner.

The ability of the amplifier system to operate in partial push-pull is very unique and advantageous. The system can satisfy both the efficiency (i.e. using the exact number of active devices as needed) and even harmonic termination (i.e. using a push-pull mode) criteria, simultaneously.

6. Since the topology is operated under the principle of adding elementary device impedance to reach the level of port impedance, it has the potential of extremely high upper bound of maximum output power. This is due to the fact that, if insertion loss can be kept low, this power combining scheme itself does not limit the number of active devices which can be combined, unlike the limit imposed by the conventional parallel corporate combining scheme.

Second Preferred Embodiment, Push-Pull Transistor Configurations

FIG. 5 shows a second embodiment of the present invention that is very similar to the FIG. 1 embodiment. In the FIG. 5 embodiment, the adjacent transistor pairs may be operated in push-pull to reduce the even harmonic contents, especially the second harmonic. In FIG. 5, transistors 106 and 107 are operated in push-pull. Similarly, transistors 108 and 109 are operated in push-pull. However, transistor 110 can operate in a single-ended manner. Yet, overall, the series power combining scheme still function as intended. In this modification, nodes 7, 8, 11, 12, 15, 17, 18, 21, 22, 25, 31 and 32 are grounded to achieve the proper transforming as well as push-pull effects.

Third Preferred Embodiment, Coaxial Line 1:1 Transformers

Figure 6:
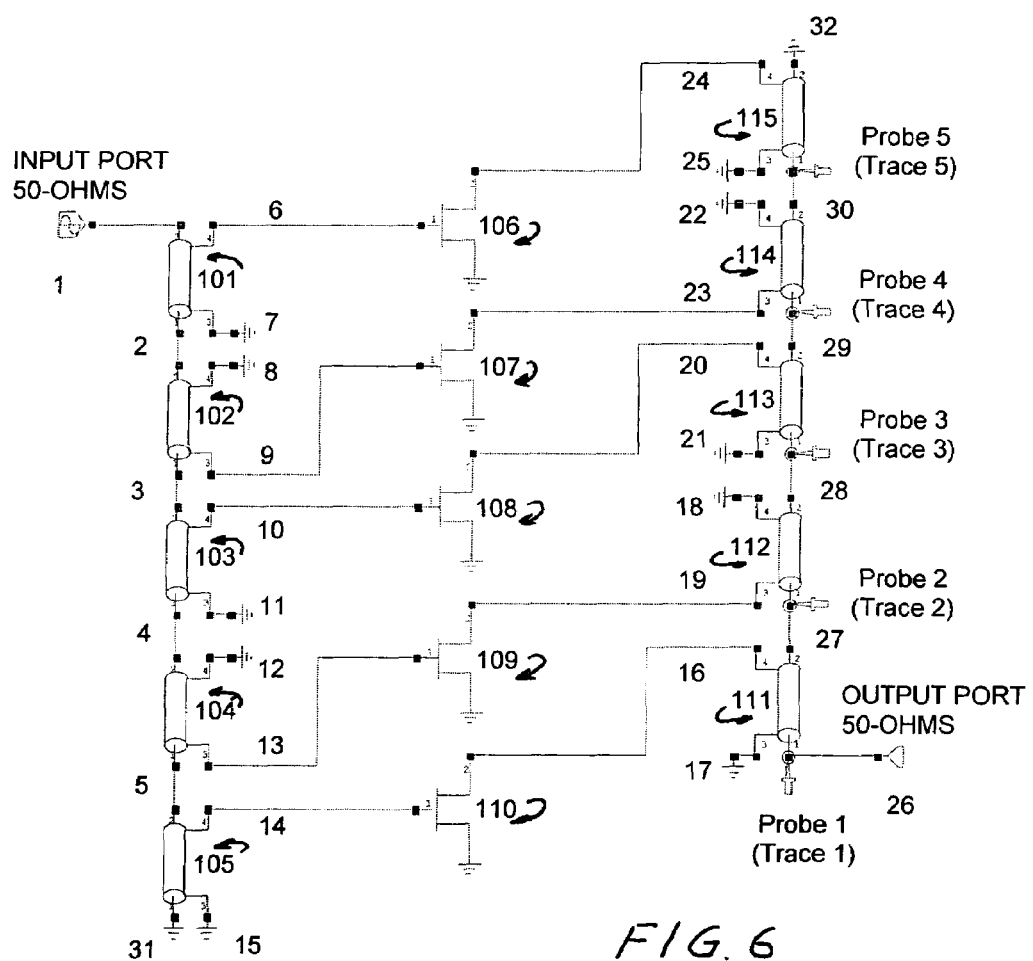
FIG. 6 shows a design of a 1 kW proposed art power amplifier using practical coaxial lines and 200W amplifier modules, designed using LDMOS (MRF9060) devices.

FIG. 6 shows another embodiment of the present invention which is also a 1 kW solid-state amplifier system, operating in partial push-pull using coaxial lines, over the bandwidth from 100 MHz to 1000 MHz. Coaxial lines 101, 102, 103, 104 and 105 perform the functions of the input 1:1 transformers. Coaxial lines 111, 112, 113, 114 and 115 perform the functions of the output 1:1 transformers. Active devices 106, 107, 108, 109 and 110 are 200W amplifier modules which are constructed with LDMOS transistors (available at www.freescale.com, Part Number MRF9060), biased at 28V on the drains. The 200W amplifier modules are comprised of five LDMOS transistors, with one transistor driving four series-connected transistors to generate the 200W output power and a terminal impedance of 10-Ohms at both the input and output, of each 200W amplifier module. FIG. 7 shows the simulated results of nodal voltage signals at the output of the amplifier system illustrated in FIG. 6. The simulations were performed using Microwave Office, by Applied Wave Research (www.appwave.com), within which the full non-linear model for the LDMOS device MRF9060is included. The time-domain voltages at nodes 30 (Trace 5), 29 (Trace 4), 28 (Trace 3), 27 (Trace 2) and 26 (Trace 1) indicate that they are all well aligned in phase and thus add linearly to successfully combine the power of all active devices in the amplifier. The time-domain responses shown in FIG. 7 demonstrate the unique and useful voltage addition, thus impedance addition, property of the architecture of the present invention. FIG. 8 shows the simulated gain and input return loss responses of the 1 kW amplifier system to demonstrate that a decade bandwidth can be achieved from 100 MHz (0.09099 GHz) to 1000 MHz (1.079 GHz). FIG. 9 shows the simulated output power and power added efficiency response of the amplifier to illustrate that a 1 kW (i.e. 60 dBm) output power is indeed achieved simultaneously along with the decade bandwidth.

Variations

The present invention has been described in terms of specific embodiments where amplifier systems are described to meet specific requirement. However persons skilled in the art will recognize that a great many variations are possible within the spirit of the present invention.

Port Impedances Other Than 50-Ohms

For example, the preferred embodiments are described in terms of matching impedance of the amplifier system to 50-Ohm input and output impedances which are standard impedance normally found in most situations in the frequency ranges to which this invention is directed. However, the present invention can easily be applied to match the amplifier system to input and output impedances differing substantially from 50-Ohms. For example some radio systems are designed for output impedances of 75-Ohms. To match to this impedance, one can stack more appropriate active devices to form a longer resistive ladder, on both the input and output side, to achieve the higher collective impedance.

Input Port and Output Port Not of the Same Impedance

In the case in which the amplifier system calls for an input port impedance different from that of an output port impedance, the proposed invention can be easily adjusted to accommodate such requirement. The flexibility of the proposed invention can easily support this rather unusual requirement. In this case, the impedance of the input transformer ladder and input impedance of the active device are thus set to operate at an impedance value different from the output impedance of the active devices and the impedance of the output transformer latter. Preferably, the input impedances of the active devices are designed such that the total impedance of all the active devices is equal to the input port impedance. Similarly, the same concept applies to the output side.

For example, if the desired input port impedance is 50 Ohms and the desired output port impedance is 80 Ohms and the required output power calls for series combining five active devices, the terminal impedances of each active device will be set as follows. The input impedance of each active device will be matched to 10 Ohms. The output impedance of each device will be matched to 16 Ohms. When five of such active devices are series combined, with corresponding 1:1 transformers (input transformers operating at 10 Ohms and output transformers operating at 16 Ohms), the resulting input collective impedance will be 50 Ohms and output collective impedance will be 80 Ohms, as desired.

Rectangular Coaxial Structures for Balun Transformers

Figure 10:
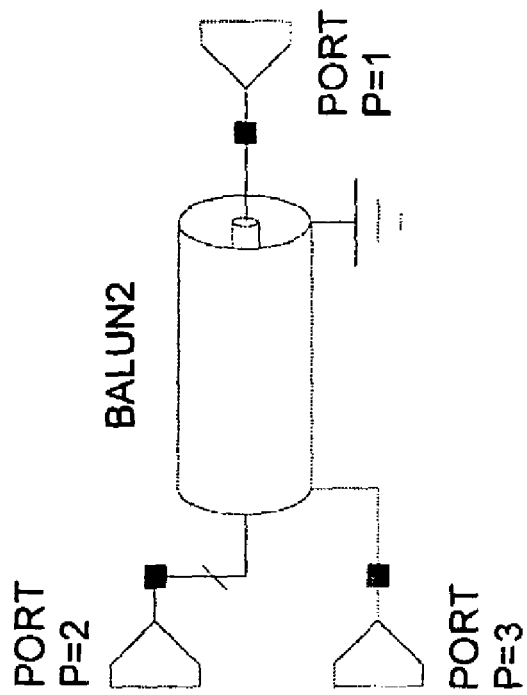
FIG. 10 shows a possible realization of the 1:1 transformer at high frequencies by using a 4-port rectangular or circular coaxial line.
Figure 10:
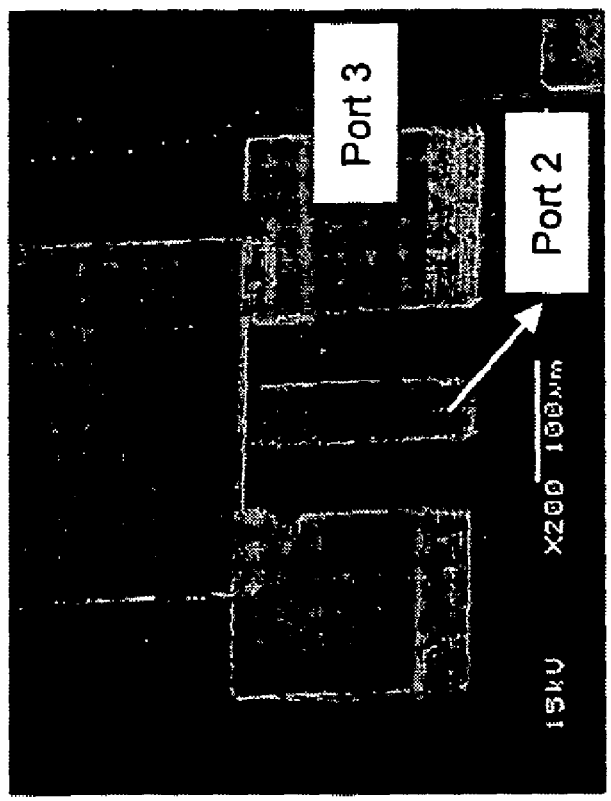

FIG. 10 shows a photograph of a rectangular coaxial structure that was fabricated using a micro-machined process and an electrical model of how such a coaxial structure can be used to create a balun transformer. This rectangular coax can operate with low loss and wide bandwidth at any frequency ranges, but is especially useful at very high frequencies. Moreover, this rectangular coaxial structure can be operated as a 4-port structure which makes it ideal as a 1:1 transformer. As seen in FIG. 10, on one end of the coax, the center conductor can be used as Port 2 and the outside conductor Port 3. This realization is very consistent with what is required in a balun transformer as shown by the conventional circular coaxial line in FIG. 10. Therefore, both rectangular and conventional circular coaxial lines can indeed be used to realize the 1:1 transformers needed for this architecture.

Other Active Devices

Even though the description of the proposed amplifier architecture thus far concentrates on combining solid-state active devices, the proposed topology is in fact device independent. This means that this architecture can be used with any active devices for the purpose of combining power. Devices such as vacuum tube modules and reflection-type (diode based) modules are indeed useable within the proposed architecture.

While there have been shown what are presently considered to be preferred embodiments of the present invention, it will be apparent to those skilled in the art that various changes and modifications can be made herein without departing from the scope and spirit of the invention. Therefore, the scope of the invention is to be determined by the appended claims and their legal equivalents.

What is claimed is:

1. A wide bandwidth, high power amplifier system for amplifying a signal, in a bandwidth range within the frequency range from the HF band (1 MHz) up to the millimeter-wave band (100 GHz), received at an input port defining an input port impedance and delivering the amplified signal to an output port defining an output impedance, said amplifier system comprising:
   A) a plurality of amplifier modules,
   B) a first plurality of more than two transformers connected in series in a non-binary architecture, defining a series of input transformers, with each transformer of said first plurality of transformers adapted to provide an input signal to one amplifier module in said plurality of amplifier modules, said series of input transformers adapted to receive an input signal from an input port,
   C) a second plurality of more than two transformers connected in series in a non-binary architecture with each transformer of said second plurality of transformers adapted to receive an input signal from one amplifier module in said plurality of amplifier modules, said series of output transformers adapted to transmit an amplified output signal to an output port,
wherein said series of input transformers, are adapted to provide a collective impedance matched approximately to said input impedance and said series of output transformers are adapted to provide a collective impedance matched approximately to said output impedance.

2. The system as in claim 1 wherein each of said transformers in said first and said second plurality of transformers are 1:1 transformers.

3. The system as in claim 2 wherein each of said 1:1 transformers are comprised of a coaxial structure.

4. The system as in claim 1 wherein said amplifier modules are adapted to operate in a push-pull mode.

5. The system as in claim 4 wherein said modules are adapted to operate in a partial push-pull mode.

6. The system as in claim 4 wherein said modules are adapted to operate in a full push-pull mode.

7. The system as in claim 1 wherein said system is adapted to yield a performance of graceful degradation in case of short circuit.

8. The system as in claim 1 wherein said system is adapted to function as a low-noise amplifier.

9. The system as in claim 3 wherein said coaxial structure has a structural shape chosen from the following structural shapes: circular, square and rectangular.

10. The system as in claim 2 wherein said transformer comprises a type of circuit chosen from the following types of circuits: micro-strips, strip-lines, slot-lines, co-planar waveguide and multi-layer printed circuit boards.

11. The system as in claim 1 wherein said amplification modules are comprised of solid state devices.

12. The system as in claim 11 wherein said solid state devices are comprised of semiconductor material chosen from the following group of semiconductor material: silicon, SiC, GaN, GaAs and InP.

13. The system as in claim 1 wherein said amplification modules are comprised of vacuum tube devices.

14. The system as in claim 1 wherein said system is adapted to operate an HF radio spectrum.

15. The system as in claim 1 wherein said system is adapted to operate an UHF radio spectrum.

16. The system as in claim 1 wherein said system is adapted to operate an EHF radio spectrum.

17. The system as in claim 1 wherein said system is adapted to operate a millimeter wave radio spectrum.

18. The system as in claim 1 wherein said input impedance and said output impedance are equal or approximately equal.

19. The system as in claim 1 wherein said input impedance said output impedance are substantially different.

* * * * *